(12) United States Patent
Hwang et al.

(10) Patent No.: US 11,923,309 B2
(45) Date of Patent: Mar. 5, 2024

(54) SEMICONDUCTOR PACKAGE INCLUDING FINE REDISTRIBUTION PATTERNS

(71) Applicant: Samsung Electronics Co., Ltd., Suwon-si (KR)

(72) Inventors: Hyunsu Hwang, Siheung-si (KR); Junyun Kweon, Cheonan-si (KR); Jumyong Park, Cheonan-si (KR); Jin Ho An, Seoul (KR); Dongjoon Oh, Suwon-si (KR); Chungsun Lee, Anyang-si (KR); Ju-Il Choi, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 163 days.

(21) Appl. No.: 17/210,044

(22) Filed: Mar. 23, 2021

(65) Prior Publication Data

US 2022/0037255 A1 Feb. 3, 2022

(30) Foreign Application Priority Data

Jul. 31, 2020 (KR) .......................... 10-2020-0096203

(51) Int. Cl.
*H01L 23/538* (2006.01)
*H01L 21/48* (2006.01)
(Continued)

(52) U.S. Cl.
CPC ...... *H01L 23/5383* (2013.01); *H01L 21/4857* (2013.01); *H01L 23/5386* (2013.01);
(Continued)

(58) Field of Classification Search
CPC ............. H01L 23/5383; H01L 23/5386; H01L 21/4857; H01L 25/0652; H01L 25/105;
(Continued)

(56) References Cited

U.S. PATENT DOCUMENTS 4,357,203 A 11/1982 Zelez
4,487,652 A 12/1984 Almgren
(Continued)

FOREIGN PATENT DOCUMENTS

KR 20010025972 A 4/2001
KR 1020090043985 5/2009

*Primary Examiner* — Kyoung Lee
*Assistant Examiner* — Christina A Sylvia
(74) *Attorney, Agent, or Firm* — Myers Bigel, P.A.

(57) ABSTRACT

Disclosed are semiconductor packages and methods of fabricating the same. The semiconductor package includes a redistribution substrate including redistribution line patterns in a dielectric layer, and a semiconductor chip on the redistribution substrate. The semiconductor chip includes chip pads electrically connected to the redistribution line patterns. Each of the redistribution line patterns has a substantially planar top surface and a nonplanar bottom surface. Each of the redistribution line patterns includes a central portion and edge portions on opposite sides of the central portion. Each of the redistribution line patterns has a first thickness as a minimum thickness at the central portion and a second thickness as a maximum thickness at the edge portions.

20 Claims, 18 Drawing Sheets

(51) Int. Cl.
*H01L 25/065* (2023.01)
*H01L 25/10* (2006.01)

(52) U.S. Cl.
CPC ........ *H01L 25/0652* (2013.01); *H01L 25/105* (2013.01); *H01L 2225/06513* (2013.01); *H01L 2225/06517* (2013.01); *H01L 2225/06541* (2013.01); *H01L 2225/06586* (2013.01); *H01L 2225/06589* (2013.01); *H01L 2225/1035* (2013.01); *H01L 2225/1041* (2013.01); *H01L 2225/1058* (2013.01)

(58) Field of Classification Search
CPC . H01L 2225/06513; H01L 2225/06517; H01L 2225/06541; H01L 2225/06586; H01L 2225/06589; H01L 2225/1035; H01L 2225/1041; H01L 2225/1058; H01L 2224/16145; H01L 24/10; H01L 25/18; H01L 23/3675; H01L 23/49816; H01L 23/5385; H01L 25/0657; H01L 2224/16146; H01L 2224/16225; H01L 2224/18; H01L 2224/32225; H01L 2224/73204; H01L 2224/73253; H01L 2225/107; H01L 2924/15174; H01L 2924/15311; H01L 2924/16152; H01L 2924/181; H01L 23/488; H01L 21/4846; H01L 21/50; H01L 23/49838; H01L 24/02; H01L 2224/0231; H01L 2224/0237; H01L 23/525; H01L 23/293; H01L 23/485; H01L 23/528; H01L 24/06; H01L 24/16; H01L 24/13; H01L 24/73; H01L 24/81

See application file for complete search history.

(56) References Cited

U.S. PATENT DOCUMENTS

| | | | |
|---|---|---|---|
| 5,470,693 | A | 11/1995 | Sachdev et al. |
| 7,419,902 | B2 | 9/2008 | Uno et al. |
| 10,090,241 | B2 | 10/2018 | Chen et al. |
| 10,157,864 | B1 | 12/2018 | Yu et al. |
| 10,162,139 | B1* | 12/2018 | Wang ............. G02B 6/122 |
| 10,818,621 | B2* | 10/2020 | Lee ............. H01L 24/13 |
| 11,552,037 | B2* | 1/2023 | Kim ............. H01L 24/20 |
| 2013/0119528 | A1* | 5/2013 | Groothuis ......... H01L 25/0657 257/777 |
| 2017/0271248 | A1* | 9/2017 | Chen ............. H01L 23/5389 |
| 2018/0151525 | A1* | 5/2018 | Cheng ............. H01L 21/02282 |
| 2019/0229078 | A1* | 7/2019 | Kim ............. H01L 24/19 |
| 2020/0126940 | A1 | 4/2020 | Yu et al. |
| 2020/0176387 | A1* | 6/2020 | Yu ............. H01L 21/6835 |
| 2022/0037248 | A1* | 2/2022 | Choi ............. H01L 21/4857 |

\* cited by examiner

SEMICONDUCTOR PACKAGE INCLUDING FINE REDISTRIBUTION PATTERNS

CROSS-REFERENCE TO RELATED APPLICATION

This U.S. nonprovisional application claims priority under 35 U.S.C § 119 to Korean Patent Application No. 10-2020-0096203, filed on Jul. 31, 2020 in the Korean Intellectual Property Office, the disclosure of which is hereby incorporated by reference in its entirety.

BACKGROUND

The present inventive concepts relate to a semiconductor package and a method of fabricating the same, and more particularly, to a semiconductor package including fine redistribution patterns and a method of fabricating the same.

A semiconductor package is provided to implement an integrated circuit chip for use in electronic products. Typically, the semiconductor package is configured such that a semiconductor chip is mounted on a printed circuit board (PCB) and bonding wires or bumps are used to electrically connect the semiconductor chip to the printed circuit board. With the development of the electronics industry, various studies have been conducted to improve reliability and durability of semiconductor packages.

SUMMARY

Some example embodiments of the present inventive concepts provide a compact-sized semiconductor package and a method of fabricating the same.

Objects of the present inventive concepts are not limited to that mentioned above, and other objects which have not been mentioned above will be clearly understood to those skilled in the art from the following description.

According to some example embodiments of the present inventive concepts, a semiconductor package may include: a redistribution substrate including a plurality of redistribution line patterns in a dielectric layer; and a semiconductor chip on the redistribution substrate, the semiconductor chip including a plurality of chip pads electrically connected to the redistribution line patterns. Each of the redistribution line patterns may include a substantially planar top surface and a nonplanar bottom surface. Each of the redistribution line patterns may include a central portion and edge portions on opposite sides of the central portion. Each of the redistribution line patterns may have a first thickness as a minimum thickness at the central portion and a second thickness as a maximum thickness at the edge portions.

According to some example embodiments of the present inventive concepts, a semiconductor package may include: a redistribution substrate including a plurality of redistribution patterns in a dielectric layer; and a semiconductor chip on the redistribution substrate, the semiconductor chip including a plurality of chip pads electrically connected to the redistribution patterns. Each of the redistribution patterns may include: a line part in the dielectric layer; and a via part that penetrates the dielectric layer and is connected to the line part. The line parts of each of the redistribution patterns may extend parallel to each other in a first direction. At least some of the line parts of the plurality of redistribution patterns may have a first width in a second direction perpendicular to the first direction. The line part of each of the redistribution patterns may include a central portion and edge portions on opposite sides of the central portion. The line part of each of the redistribution patterns may include a bottom surface that is upwardly convex at the central portion.

According to some example embodiments of the present inventive concepts, a semiconductor package may include: a package substrate; a redistribution substrate on the package substrate, the redistribution substrate including a photosensitive polymer layer and a plurality of redistribution patterns in the photosensitive polymer layer; a first semiconductor chip on the redistribution substrate; a second semiconductor chip on the redistribution substrate and spaced apart from the first semiconductor chip, the second semiconductor chip including a plurality of vertically stacked memory chips; a plurality of first connection terminals between the redistribution substrate and the first semiconductor chip and between the redistribution substrate and the second semiconductor chip; a plurality of second connection terminals that connect the package substrate to the redistribution substrate; a molding layer on the redistribution substrate, the molding layer at least partially covering the first semiconductor chip and the second semiconductor chip; and a thermal radiation structure on the package substrate, the thermal radiation structure covering or overlying the redistribution substrate, the first semiconductor chip, and the second semiconductor chip. Each of the redistribution patterns may include: a line part that extends along one direction in a dielectric layer; and a via part that penetrates the dielectric layer and is connected to the line part. The line part of each of the redistribution patterns may include a substantially planar top surface, a nonplanar bottom surface, and first and second rounded edges between the bottom surface and opposite first and second sidewalls of the line part. The line part of each of the redistribution patterns may include a central portion and first and second edges portions on opposite sides of the central portion. The line part of each of the redistribution patterns may have a first thickness as a minimum thickness at the central portion and a second thickness as a maximum thickness at the first and second edge portions.

According to some example embodiments of the present inventive concepts, a method of fabricating a semiconductor package may include: forming a redistribution substrate; and mounting a semiconductor chip on the redistribution substrate. The step of forming the redistribution substrate may include: forming a hardmask layer on a dielectric layer; forming a photoresist pattern on the hardmask layer; forming a hardmask pattern on the dielectric layer using the photoresist pattern as an etching mask to etch the hardmask layer; and forming a plurality of trenches using the hardmask pattern as an etching mask to etch a portion of the dielectric layer, wherein the plurality of trenches extend parallel to each other in one direction. The step of forming the hardmask pattern may include forming on the dielectric layer a plurality of preliminary trenches that extend parallel to each other in the one direction. Each of the preliminary trenches may have a depth that is greater at an edge portion of the preliminary trench than at a central portion of the preliminary trench. Each of the trenches may include a bottom surface that is upwardly convex and rounded edges between the bottom surface and sidewalls of the trench.

Details of other example embodiments are included in the description and drawings.

DETAILED DESCRIPTION OF EMBODIMENTS

The following will now describe a semiconductor package and a method of fabricating the same according to some example embodiments of the present inventive concepts in conjunction with the accompanying drawings.

Figure 1:
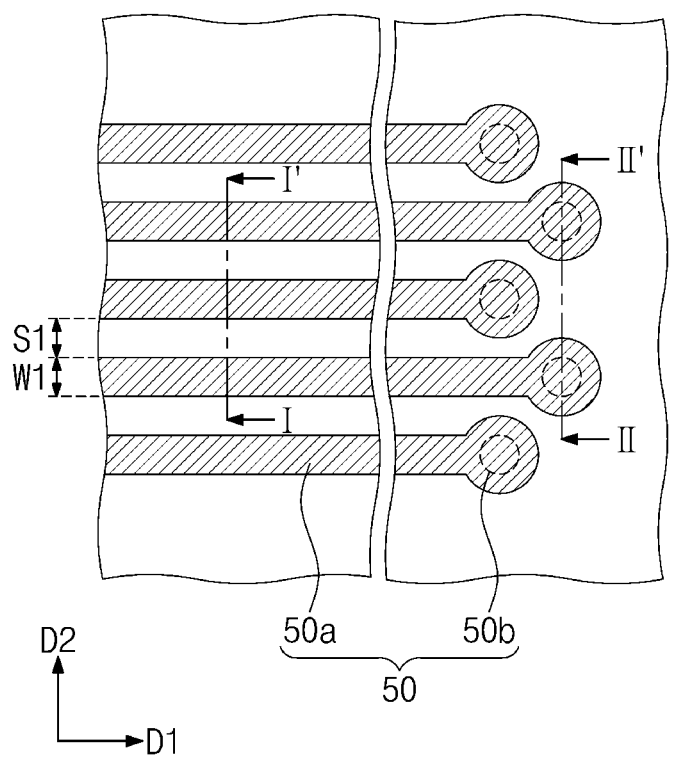
FIG. 1 illustrates a plan view partially showing a redistribution substrate of a semiconductor package according to some example embodiments of the present inventive concepts.

FIG. 1 illustrates a plan view partially showing a redistribution substrate of a semiconductor package according to some example embodiments of the present inventive concepts. FIGS. 2 to 7 illustrate cross-sectional views taken along lines I-I' and II-II' of FIG. 1, showing a method of fabricating redistribution patterns of a semiconductor package according to some example embodiments of the present inventive concepts. FIG. 8 illustrates a cross-sectional view showing a line part of a redistribution pattern formed by a method of fabricating redistribution patterns of a semiconductor package according to some example embodiments of the present inventive concepts.

Figure 2:
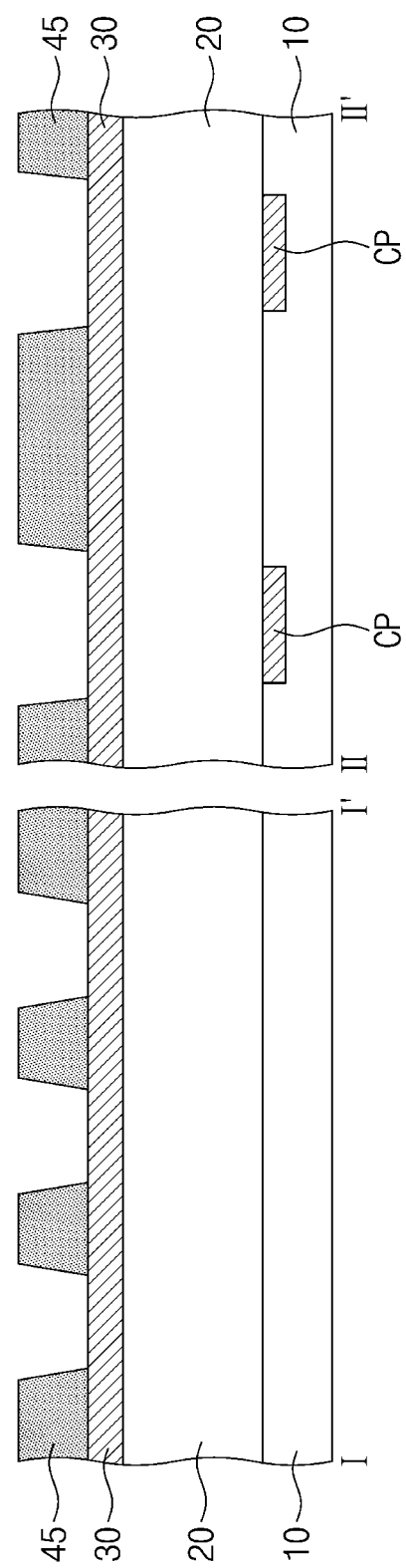
FIGS. 2 to 7 illustrate cross-sectional views taken along lines I-I' and II-II' of FIG. 1, showing a method of fabricating redistribution patterns of a semiconductor package according to some example embodiments of the present inventive concepts.

Referring to FIGS. 1 and 2, a conductive pattern CP may be formed on a lower layer 10. Although not shown, the lower layer 10 may include a carrier substrate, a semiconductor substrate, or a dielectric layer. The lower layer 10 may include a memory circuit, a logic circuit, or semiconductor integrated circuits including a combination of memory and logic circuits formed on a semiconductor substrate, and may also include multi-stacked dielectric layers that cover the semiconductor integrated circuits.

The conductive pattern CP may be formed by performing a deposition process, a patterning process, an electroplating process, or an electroless plating process. The conductive pattern CP may be formed of metal or its alloy each of which includes at least one selected from copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C).

A dielectric layer 20 may be formed on the lower layer 10. For example, the dielectric layer 20 may be formed by using a coating process, such as spin coating or slit coating. Although a single dielectric layer 20 is illustrated, the dielectric layer 20 may include multi-stacked dielectric layers.

The dielectric layer 20 may include, for example, a photosensitive polymer. The photosensitive polymer may include, for example, one or more of photosensitive polyimide, polybenzoxazole, phenolic polymers, and benzocyclobutene polymers. Alternatively, the dielectric layer 20 may include, for example, a silicon oxide layer, a silicon nitride layer, or a silicon oxynitride layer.

A hardmask layer 30 may be formed on the dielectric layer 20, and a photoresist pattern 45 may be formed on the hardmask layer 30.

The hardmask layer 30 may be formed of a material having an etch selectivity with respect to the dielectric layer 20. The hardmask layer 30 may include titanium, titanium nitride, tantalum, tantalum nitride, tungsten, or any suitable metallic material. Alternatively, the hardmask layer 30 may be a polysilicon layer, a silicon nitride layer, or a silicon oxynitride layer. The hardmask layer 30 may be formed by using physical vapor deposition (PVD), chemical vapor deposition (CVD), or atomic layer deposition (ALD).

The photoresist pattern 45 may be formed by forming a photoresist layer on the hardmask layer 30, and then performing exposure and development processes. The photoresist pattern 45 may include openings that partially expose the hardmask layer 30, and the openings may have their linear shapes. For example, the photoresist pattern 45 may include a line-and-space pattern. The photoresist pattern 45 may have a linewidth of about 1.5 μm to about 2.5 μm.

Figure 3:
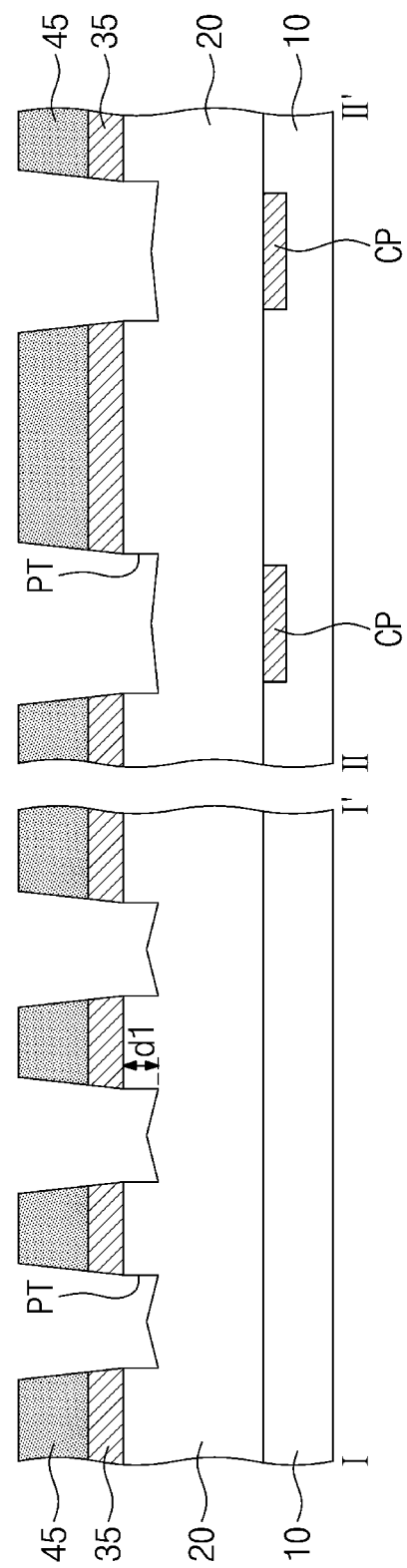

Referring to FIGS. 1 and 3, the photoresist pattern 45 may be used as an etching mask to perform an anisotropic etching process on the hardmask layer 30. A hardmask pattern 35 may thus be formed on the dielectric layer 20. The anisotropic etching process on the hardmask layer 30 may include reactive ion etching (RIE), magnetically enhanced reactive ion etching (MERIE), inductively coupled plasma (ICP) etching, transformer coupled plasma (TCP) etching, hollow anode type plasma etching, or helical resonator plasma etching.

The anisotropic etching process on the hardmask layer 30 may use $C_xF_y$-based etching gas. For example, the etching gas may include $CF_4$, $C_3F_6$, $C_4F_6$, $C_4F_8$, $C_5F_8$, $CH_3F$, $CHF_3$, $CH_2F_2$, or any combination thereof. In addition, an inert gas such as argon (Ar) may be used in the anisotropic etching process on the hardmask layer 30.

The dielectric layer 20 may be partially etched due to over-etching in the anisotropic etching process on the hardmask layer 30. Therefore, preliminary trenches PT may be formed on an upper portion of the dielectric layer 20.

When plasma is used to anisotropically etch the hardmask layer 30, active ions of the etching gas may have strong directionality to allow the preliminary trench PT to have a substantially perpendicular sidewall or substantially vertical sidewall. In addition, when a radio-frequency (RF) power is increased in the anisotropic etching process on the hardmask layer 30, the etching gas ions may concentrate on a corner of the preliminary trench PT. Therefore, the corner of the preliminary trench PT may be sharper than a center of a bottom surface of the preliminary trench PT. For example, the preliminary trench PT may have an uneven bottom surface, and a depth at the sidewall of the preliminary trench PT may be different from a depth at the center of the preliminary trench PT. In this case, the preliminary trench PT may have a maximum depth at the sidewall thereof. For example, the preliminary trench PT may have a depth d1 of about 0.5 μm to about 3.0 μm.

Figure 4:
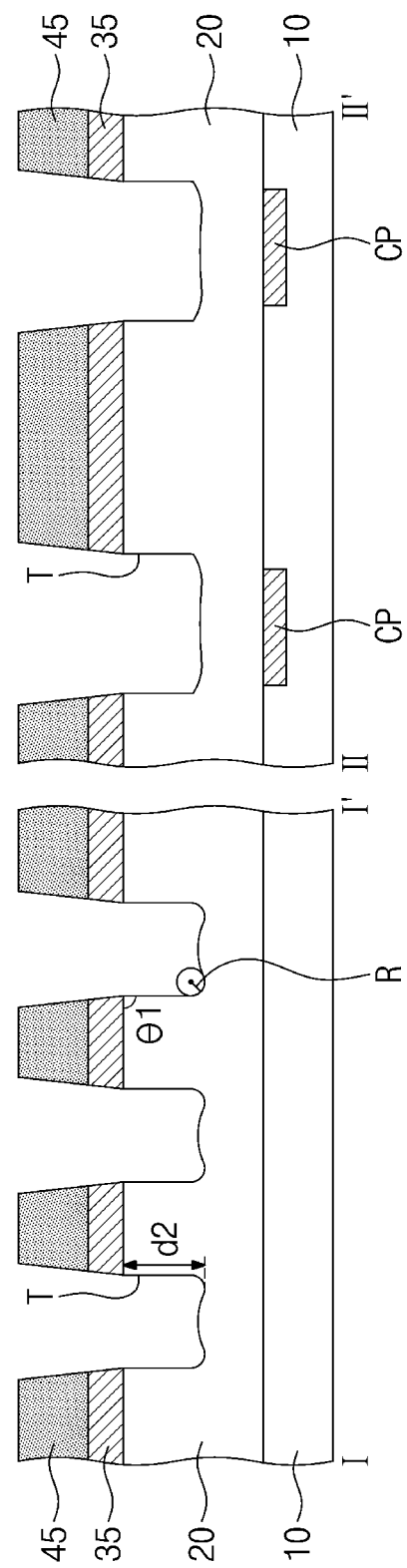

Referring to FIGS. 1 and 4, the hardmask pattern 35 may be used as an etching mask to perform an anisotropic etching process on the dielectric layer 20 exposed to the preliminary trenches PT. Thus, trenches T may be formed on the dielectric layer 20.

The anisotropic etching process on the dielectric layer 20 may include reactive ion etching (RIE), magnetically enhanced reactive ion etching (MERIE), inductively coupled plasma (ICP) etching, transformer coupled plasma (TCP) etching, hollow anode type plasma etching, or helical resonator plasma etching.

A radio-frequency (RF) power for the anisotropic etching process on the dielectric layer 20 may be less than a radio-frequency (RF) power for the anisotropic etching process on the hardmask layer 30. The anisotropic etching process on the dielectric layer 20 may use a $C_xF_y$-based etching gas and an oxygen-containing etching gas. In addition, an inert gas such as argon (Ar) may be used in the anisotropic etching process on the dielectric layer 20.

According to some example embodiments, the trenches T, formed by the anisotropic etching process in which the hardmask pattern 35 is used as an etching mask, may have their sidewalls that are substantially perpendicular to a top surface of the dielectric layer 20 (e.g., the sidewalls may be substantially vertical). For example, the sidewall of the trench T may have a first angle θ1 relative to the top surface of the dielectric layer 20, and the first angle θ1 may range from about 85° to about 95°.

The anisotropic etching process on the dielectric layer 20 may round the sharp corner of the preliminary trench PT. The trench T may have an upwardly convex bottom surface and rounded edges or corners. For example, the rounded edges may be formed between the bottom surface and opposite sidewalls of the trench T. The rounded edges of the trench T may have a curvature radius or radius of curvature R1 of about 0.1 μm to about 0.3 μm. The trench T may have a depth d2 of about 2.0 μm to about 3.5 μm.

Figure 5:
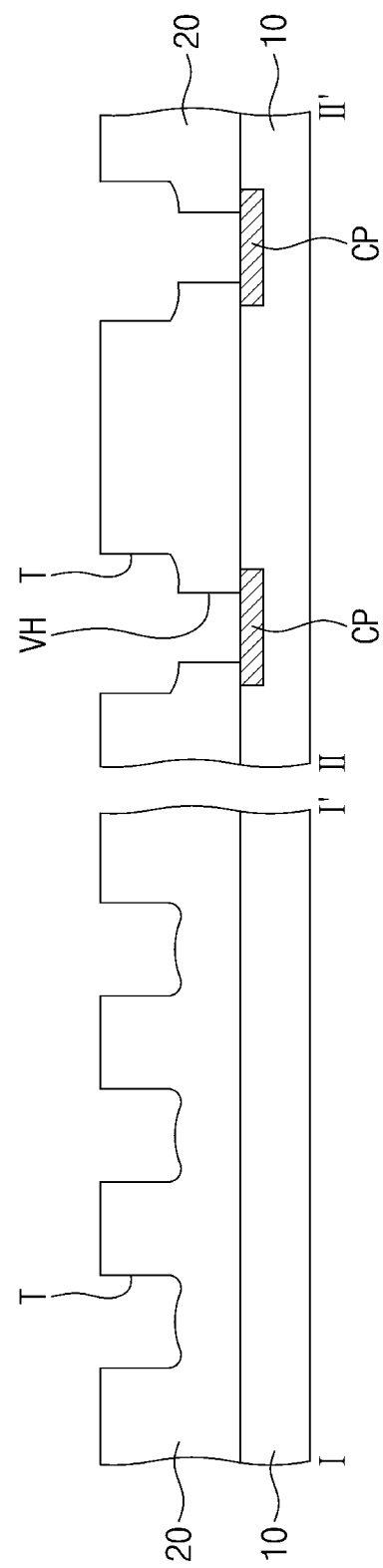

Referring to FIGS. 1 and 5, after the trenches T are formed, the photoresist pattern 45 and the hardmask pattern 35 may be removed. The photoresist pattern 45 may be removed by using a strip process that includes ashing and cleaning steps. The hardmask pattern 35 may be removed by using a wet etching process.

After the removal of the photoresist pattern 45 and the hardmask pattern 35, the trench T may have at its bottom surface a via hole VH that is formed to penetrate the dielectric layer 20. The via hole VH may expose the conductive pattern CP on the lower layer 10.

When the dielectric layer 20 is formed of a photosensitive polymer layer, the via hole VH may be formed by performing exposure and development processes on the dielectric layer 20. The exposure process may be a negative tone exposure process or a positive tone exposure process.

Figure 6:
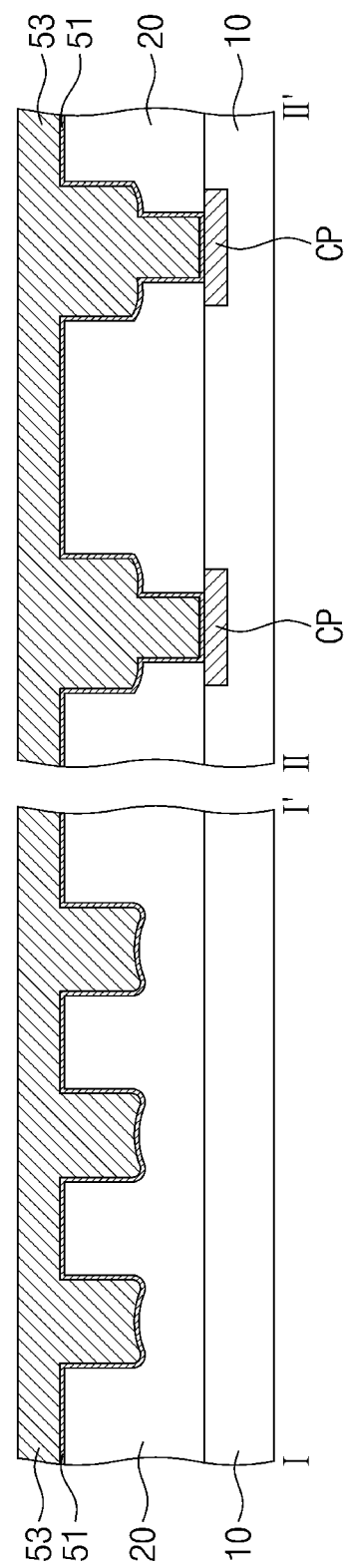

Referring to FIGS. 1 and 6, a first metal layer 51 and a second metal layer 53 may be sequentially formed on the dielectric layer 20 on which the trenches T and the via holes VH are formed.

The first metal layer 51 may be deposited to have a substantially uniform thickness on the dielectric layer 20 on which the trenches T and the via holes VH are formed. For example, the first metal layer 51 may conformally cover inner walls of the trenches T, inner walls of the via holes VH, and the top surface of the dielectric layer 20. The first metal layer 51 may be formed by using physical vapor deposition (PVD), chemical vapor deposition (CVD), or atomic layer deposition (ALD). In some example embodiments, because the trenches T have their rounded edges, a step coverage may be improved when the first metal layer 51 is deposited.

The formation of the first metal layer 51 may include sequentially depositing a metal barrier layer and a metal seed layer. The metal barrier layer may include, for example, a double layer or a mixture layer other than the double layer, which double or mixture layer may include titanium, titanium nitride, tantalum, tantalum nitride, ruthenium, cobalt, manganese, tungsten nitride, nickel, nickel boride, or titanium/titanium nitride. The metal seed layer may include, for example, copper (Cu).

The second metal layer 53 may completely fill the trenches T and the via holes VH in each of which the first metal layer 51 is formed. The second metal layer 53 may be formed on the top surface of the dielectric layer 20 on which the first metal layer 51 is formed. The second metal layer 53 may be formed by performing an electroplating process such as plating or pulse plating. The second metal layer 53 may fill the trenches T and the via holes VH from a surface of the metal seed layer.

Figure 7:
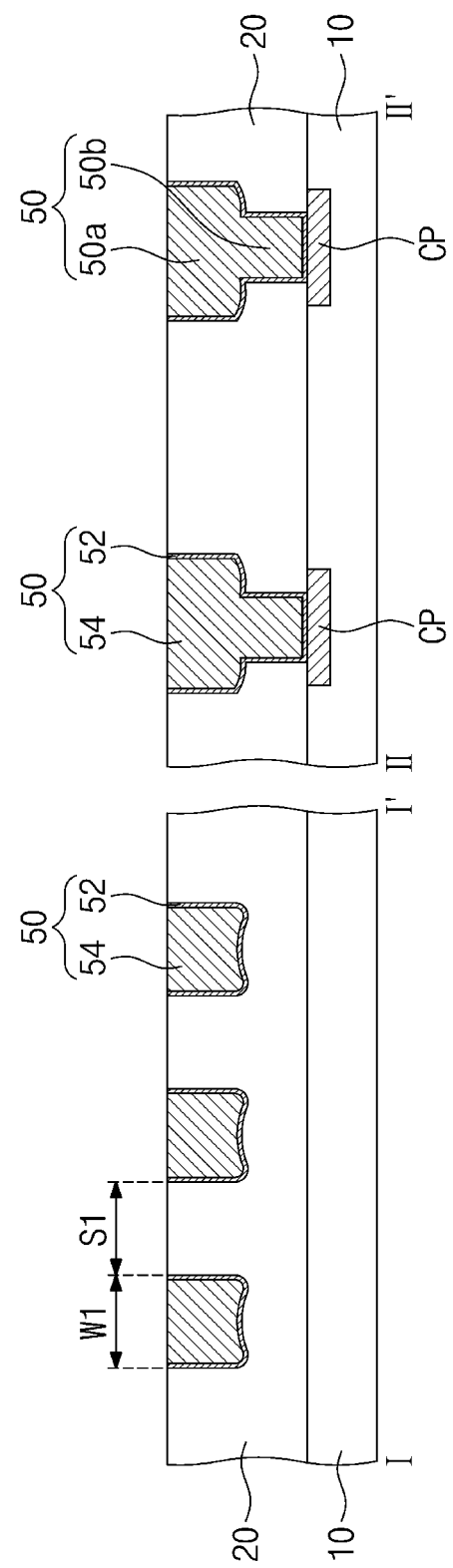
Figure 8:
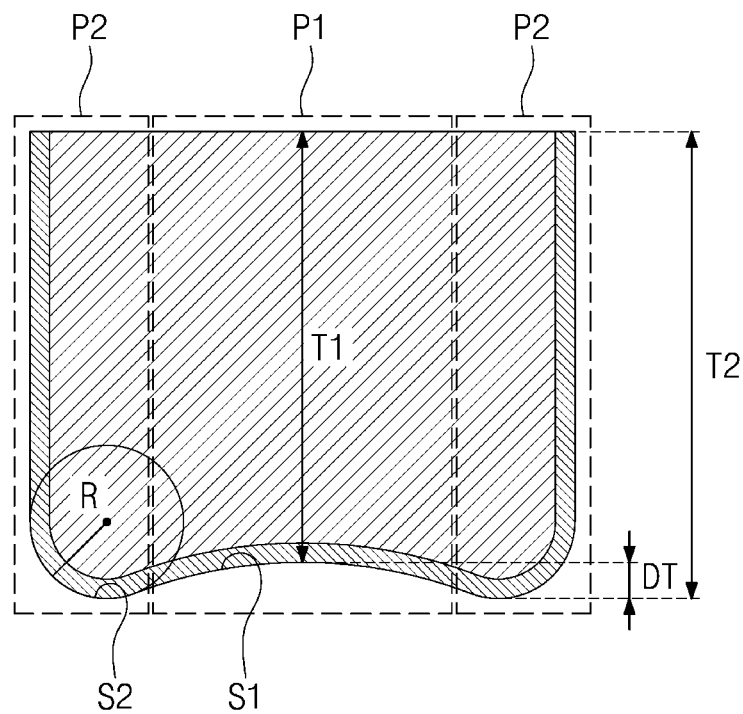
FIG. 8 illustrates a cross-sectional view showing a line part of a redistribution pattern formed by a method of fabricating redistribution patterns of a semiconductor package according to some example embodiments of the present inventive concepts.

Referring to FIGS. 1 and 7, the first and second metal layers 51 and 53 may undergo a planarization process to expose the top surface of the dielectric layer 20. A chemical mechanical polishing (CMP) process may be performed as the planarization process. The planarization process may form redistribution patterns 50 that are separated or spaced apart from each other. Each of the redistribution patterns 50 may include a first metal pattern 52 and a second metal pattern 54. The planarization process may cause the redistribution patterns 50 to have substantially even or planar top surfaces (e.g., substantially horizontal top surfaces). For example, the top surfaces of the redistribution patterns 50 may be substantially coplanar with the top surface of the dielectric layer 20. In addition, the top surfaces of the redistribution patterns 50 may be substantially parallel to a top surface of the lower layer 10 and a bottom surface of the dielectric layer 20.

Each of the redistribution patterns 50 may include a line part 50a formed in the trench T and a via part 50b formed in the via hole VH. The line part 50a may extend along one direction on the upper portion of the dielectric layer 20.

The line parts 50a of the redistribution patterns 50 may extend parallel to each other along a first direction D1. Each line part 50a may have a first width W1 in a second direction D2 perpendicular to the first direction D1. The line parts 50a may be spaced apart from each other at a first spacing S1. The first spacing S1 and the first width W1 may be substantially the same as each other.

The first width W1 of the line part 50a may range from about 0.5 μm to about 2.5 μm, and the first spacing S1 between the line parts 50a of neighboring or adjacent redistribution patterns 50 may range from about 0.5 μm to about 2.5 μm. In addition, the line part 50a of the redistribution pattern 50 may have a thickness or width W1 of about 2.5 μm to about 4.0 μm.

In some example embodiments, referring to FIG. 8, the line part 50a of the redistribution pattern 50 may have an uneven bottom surface. For example, the line part 50a of the redistribution pattern 50 may have a crooked or undulated or wavy bottom surface. The line part 50a of the redistribution pattern 50 may have a rounded edge or corner between the bottom surface and a sidewall thereof. The rounded edge of the line part 50a may have a curvature radius or radius of curvature R of about 0.1 μm to about 0.3 μm. The line part 50a of the redistribution pattern 50 may have a sidewall oriented at a first angle relative to the top surface of the dielectric layer 20, and the first angle may range from about 85° to about 95°.

The line part 50a of the redistribution pattern 50 may include a central portion P1 and edge portions P2 on opposite sides of the central portion P1. The line part 50a may have a first thickness T1 as its minimum thickness at the central portion P1 and a second thickness T2 as its maximum thickness at the edge portions P2. About 0.1 μm to about 0.2 μm may be a difference DT between the first thickness T1 as the minimum thickness and the second thickness T2 as the minimum thickness. For example, a bottom surface S1 of the central portion P1 may be convex toward or relative to a top surface of the redistribution pattern 50, and a bottom surface S2 of the edge portion P2 may be convex toward the bottom surface of the dielectric layer 20 (or concave relative to the top surface of the redistribution pattern 50). In addition, the bottom surface S2 of the edge portion P2 may have a first curvature radius or radius of curvature, and the bottom surface S1 of the central portion P1 may have a second curvature radius or radius of curvature different from the first curvature radius.

Figure 9:
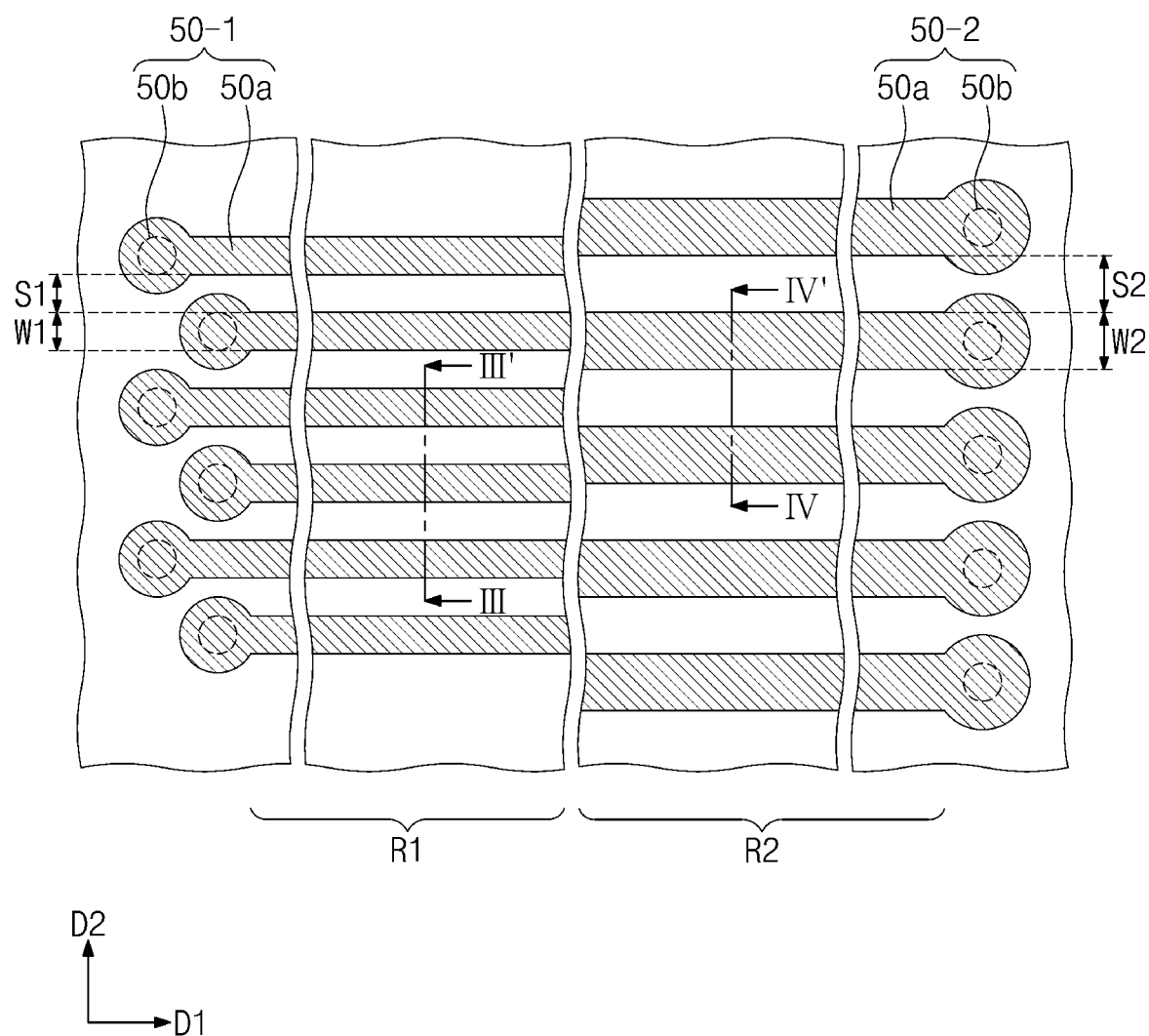
FIG. 9 illustrates a plan view partially showing a redistribution substrate of a semiconductor package according to some example embodiments of the present inventive concepts.

FIG. 9 illustrates a plan view partially showing a redistribution substrate of a semiconductor package according to some example embodiments of the present inventive concepts. FIGS. 10 to 13 illustrate cross-sectional views taken along lines III-III' and IV-IV' of FIG. 9, showing a method of fabricating redistribution patterns of a semiconductor package according to some example embodiments of the present inventive concepts.

The same technical features as those of the embodiments discussed above with reference to FIGS. 1 to 8 may be omitted in the interest of brevity of description.

Figure 10:
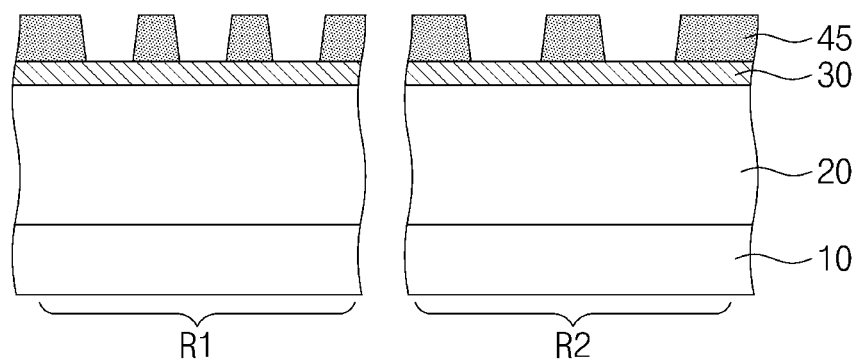
FIGS. 10 to 13 illustrate cross-sectional views taken along lines III-III' and IV-IV' of FIG. 9, showing a method of fabricating redistribution patterns of a semiconductor package according to some example embodiments of the present inventive concepts.

Referring to FIGS. 9 and 10, a lower layer 10 may include a first region R1 and a second region R2. First redistribution patterns 50-1 may be formed on the first region R1 and second redistribution patterns 50-2 may be formed on the second region R2.

As discussed with reference to FIG. 2, a dielectric layer 20 and a hardmask layer 30 may be sequentially formed on the lower layer 10, and a photoresist pattern 45 may be formed on the hardmask layer 30.

The photoresist pattern 45 may have first openings on the first region R1 and second openings on the second region R2. The first openings may have widths less than those of the second openings. The first and second openings of the photoresist pattern 45 may each have a linear shape that extends in the first direction D1.

Figure 11:
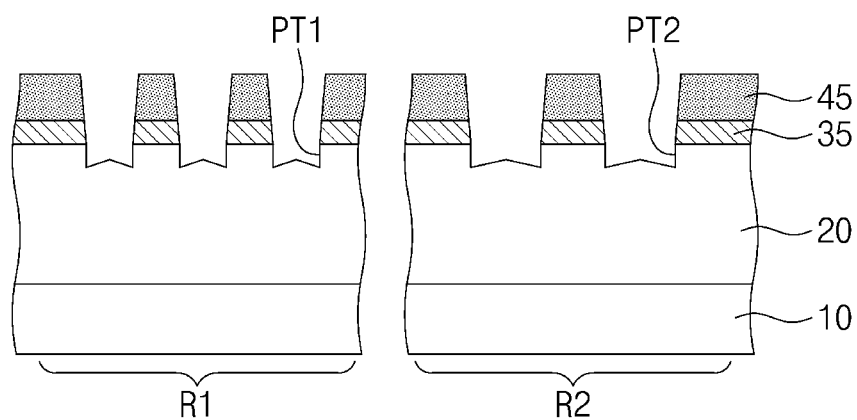

Referring to FIGS. 9 and 11, as discussed with reference to FIG. 3, the photoresist pattern 45 may be used as an etching mask to anisotropically etch the hardmask layer 30 to form a hardmask pattern 35.

During the formation of the hardmask pattern 35, first preliminary trenches PT1 may be formed on the dielectric layer 20 of the first region R1, and second preliminary trenches PT2 may be formed on the dielectric layer 20 of the second region R2.

When the first and second preliminary trenches PT1 and PT2 are formed, etching gas ions may cause the first and second preliminary trenches PT1 and PT2 to have maximum depths at their sidewalls. Corners of the first and second preliminary trenches PT1 and PT2 may become sharper than centers of bottom surfaces of the first and second preliminary trenches PT1 and PT2.

Figure 12:
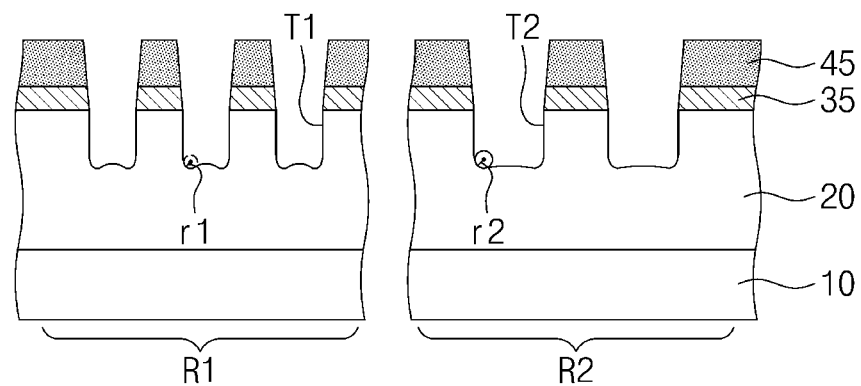

Referring to FIGS. 9 and 12, as discussed with reference to FIG. 4, the hardmask pattern 35 may be used as an etching mask to perform an anisotropic etching process on the dielectric layer 20. Therefore, first trenches T1 may be formed on the dielectric layer 20 of the first region R1, and second trenches T2 may be formed on the dielectric layer 20 of the second region R2.

According to some example embodiments, the first trenches T1 may each have a first width W1, and the second trenches T2 may each have a second width W2 greater than the first width W1. When the first and second trenches T1 and T2 are formed, loading effects may cause the second trenches T2 to have depths different from those of the first trenches T1.

As discussed above, the first and second trenches T1 and T2 may have their sidewalls that are substantially perpendicular to a top surface of the dielectric layer 20 and may also have their rounded edges. The rounded edge of the first trench T1 may have a first curvature radius or radius of curvature r1, and the rounded edge of the second trench T2 may have a second curvature radius or radius of curvature r2. The second curvature radius r2 may be greater than the first curvature radius r1.

In addition, the first and second trenches T1 and T2 may have their bottom surfaces that are upwardly convex, and the bottom surface of the first trench T1 may have a curvature radius or radius of curvature greater than that of the bottom surface of the second trench T2. Alternatively, the first trench T1 may have an upwardly convex bottom surface, and the second trench T2 may have an even or substantially planar bottom surface.

Figure 13:
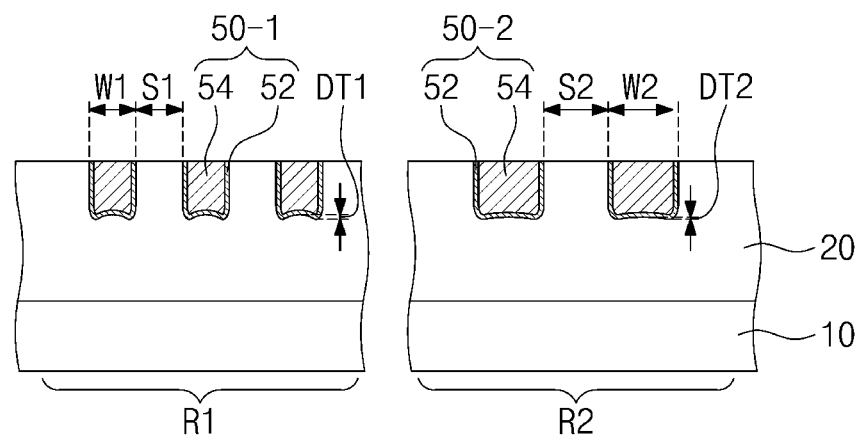

Referring to FIGS. 9 and 13, as discussed above with reference to FIGS. 5 and 6, first redistribution patterns 50-1 may be formed in the first trenches T1, and second redistribution patterns 50-2 may be formed in the second trenches T2. Each of the first and second redistribution patterns 50-1 and 50-2 may include a first metal pattern 52 and a second metal pattern 54.

According to some example embodiments, the first redistribution patterns 50-1 may each have a first width W1 and may be spaced apart from each other at a first spacing S1. The second redistribution patterns 50-2 may each have a second width W2 greater than the first width W1 and may be spaced apart from each other at a second spacing S2 greater than the first spacing S1.

Each of the first and second redistribution patterns 50-1 and 50-2 may include a central portion and edge portions on opposite sides of the central portion. On each of the first and second redistribution patterns 50-1 and 50-2, the central portion may have a minimum thickness and the edge portions may have their maximum thicknesses. For example, a difference DT1 between the maximum and minimum thicknesses of the first redistribution pattern 50-1 may be greater than a difference DT2 between the maximum and minimum thicknesses of the second redistribution pattern 50-2.

Figure 14:
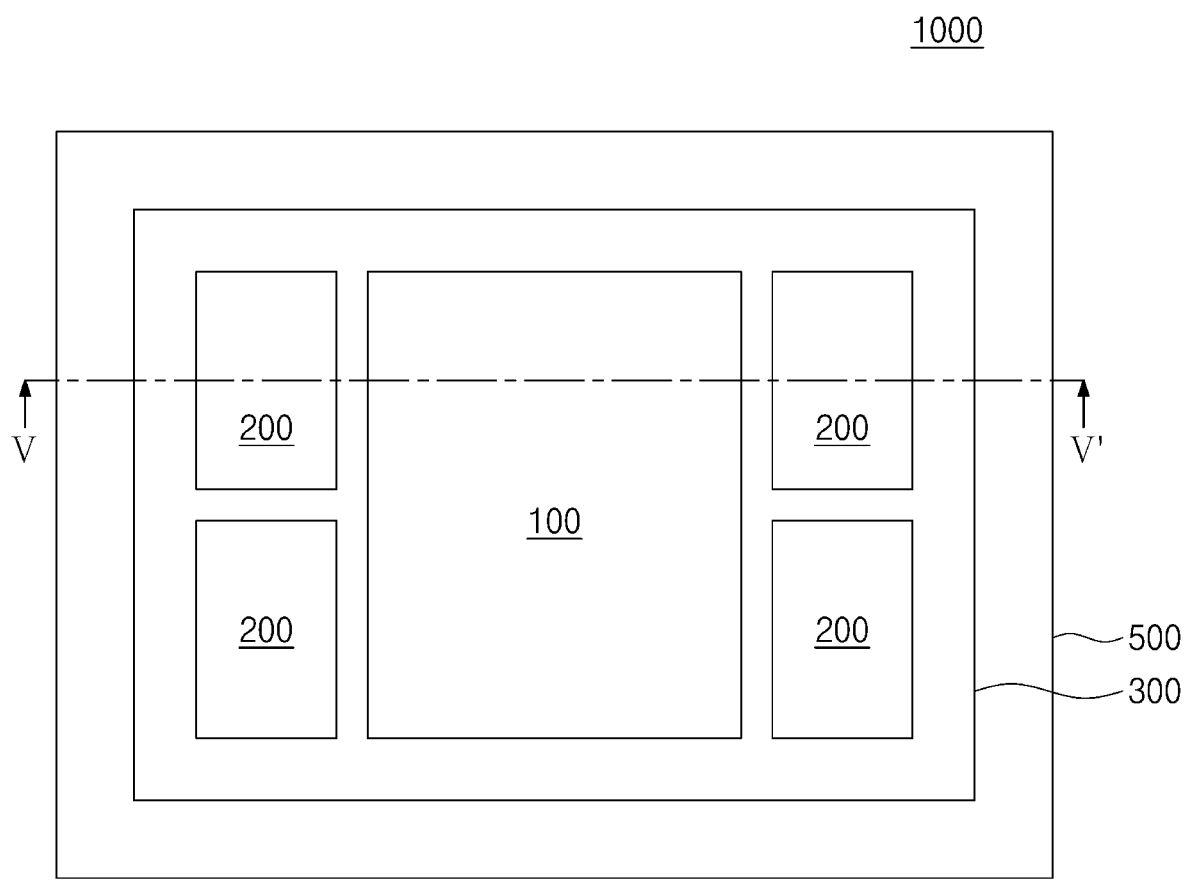
FIG. 14 illustrates a simplified plan view showing a semiconductor package according to some example embodiments of the present inventive concepts.
Figure 15:
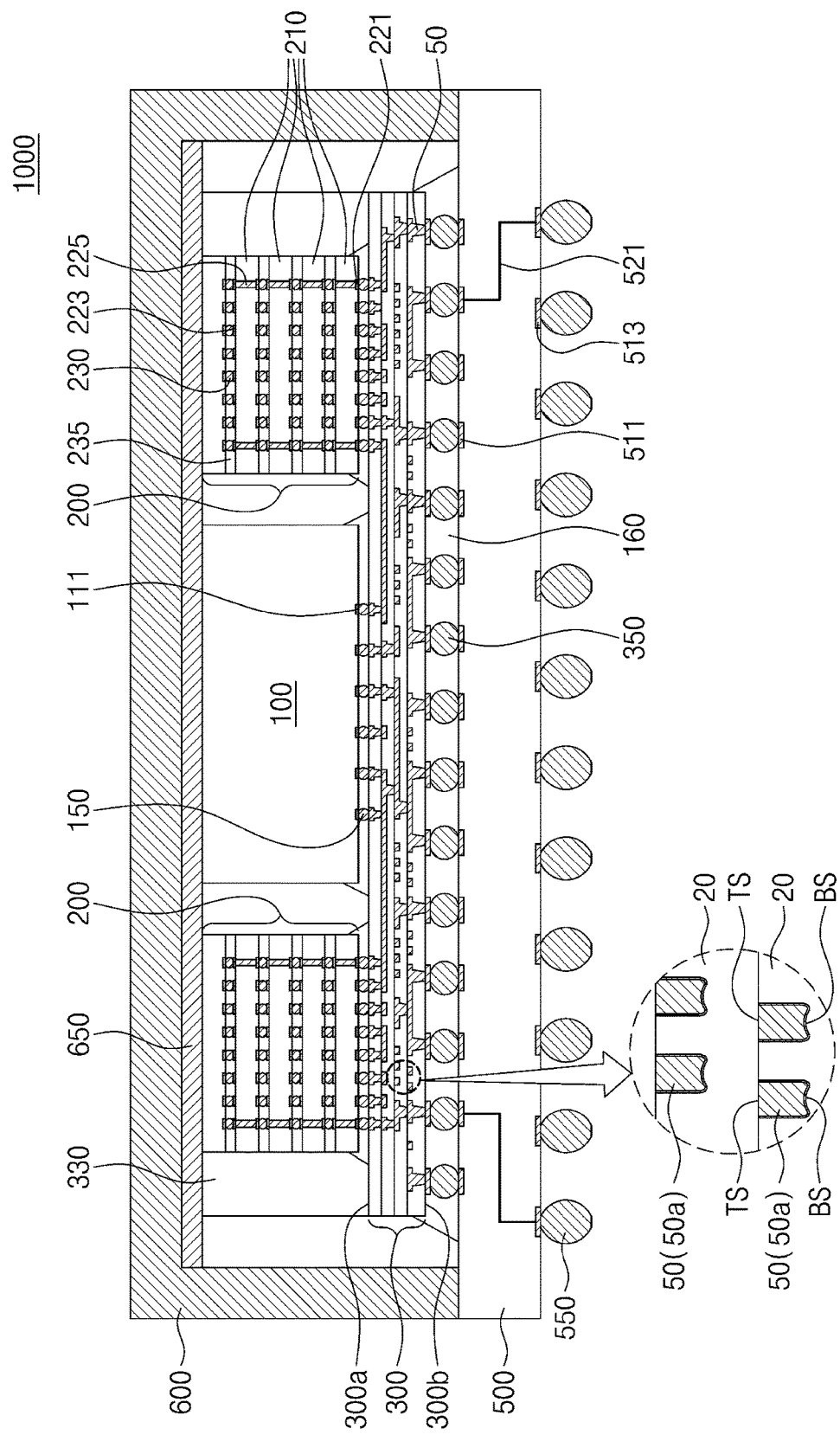
FIGS. 15, 16, and 17 illustrate cross-sectional views taken along line V-V' of FIG. 14, showing a semiconductor package according to some example embodiments of the present inventive concepts.
Figure 16:
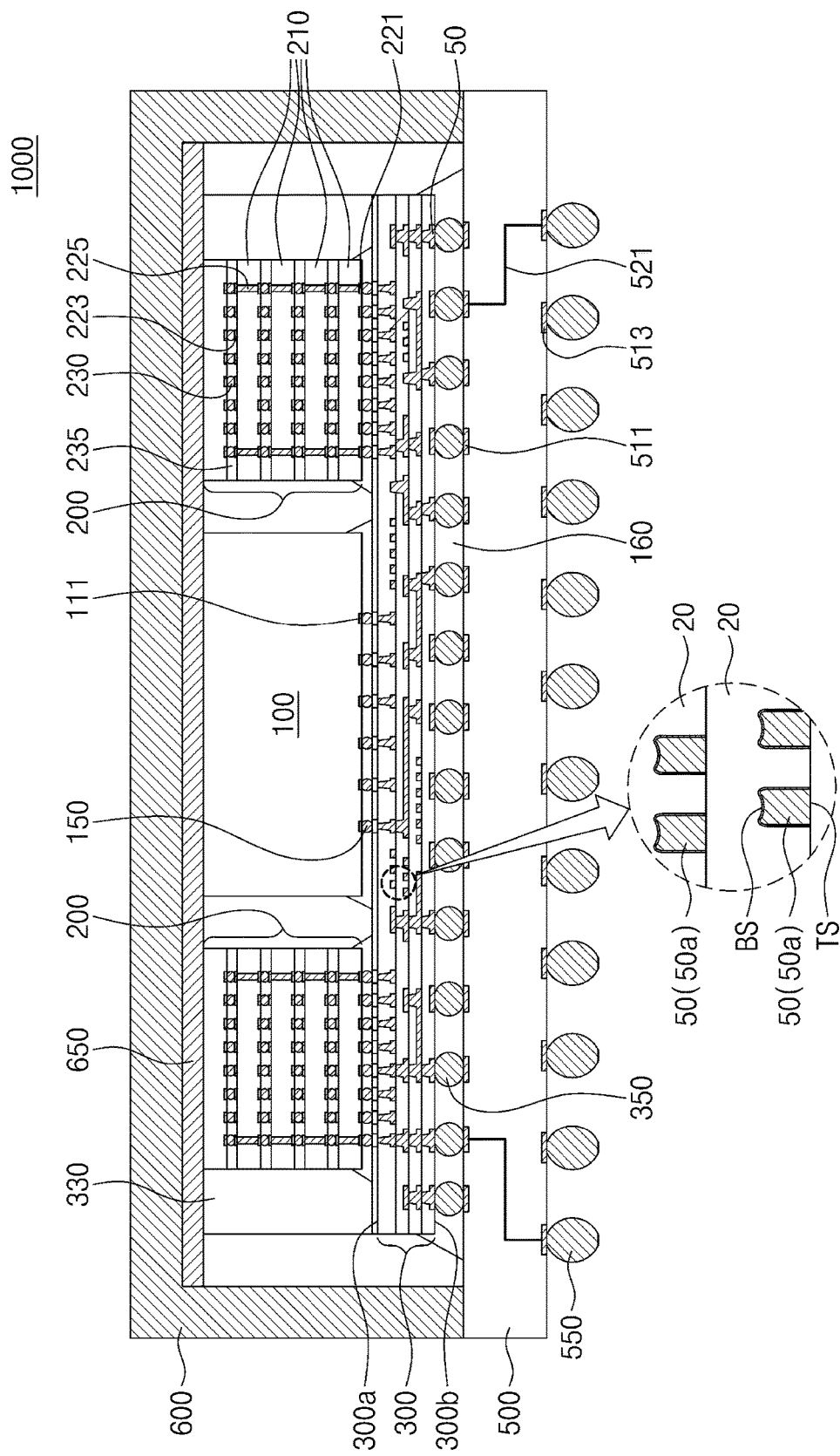
Figure 17:
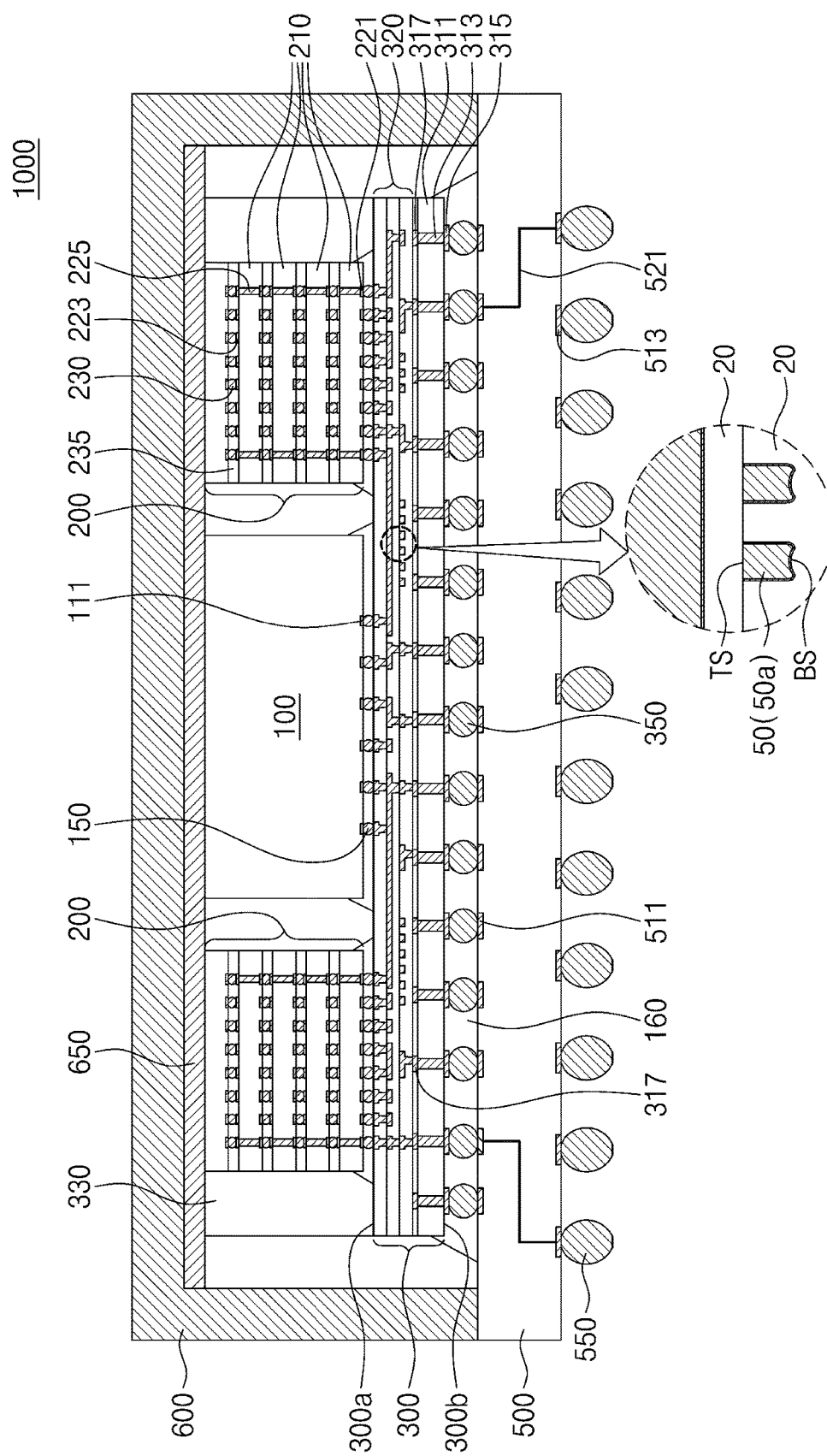

FIG. 14 illustrates a simplified plan view showing a semiconductor package according to some example embodiments of the present inventive concepts. FIGS. 15, 16, and 17 illustrate cross-sectional views taken along line V-V' of FIG. 14, showing a semiconductor package according to some example embodiments of the present inventive concepts. The same technical features as those of the embodiments discussed above with reference to FIGS. 1 to 8 may be omitted in the interest of brevity of description.

Referring to FIGS. 14, 15, 16, and 17, a semiconductor package 1000 may include a first semiconductor chip 100, second semiconductor chips 200, a redistribution substrate 300, a package substrate 500, and a thermal radiation structure 600.

The first and second semiconductor chips 100 and 200 may be disposed on a top surface of the redistribution substrate 300.

The first semiconductor chip 100 may have lower chip pads 111 on a bottom surface thereof. The first semiconductor chip 100 may be a logic chip including a processor, such as a microelectromechanical system (MEMS) device, an optoelectronic device, a central processing unit (CPU), a graphic processing unit (GPU), a mobile application, or a digital signal processor (DSP). The first semiconductor chip 100 may have a thickness of about 700 µm to about 775 µm.

The redistribution substrate 300 may be provided thereon with the second semiconductor chips 200 spaced apart from the first semiconductor chip 100. Each of the second semiconductor chips 200 may include a plurality of memory chips 210 that are vertically stacked. The plurality of memory chips 210 may be electrically connected to each other through lower and upper chip pads 221 and 223, chip through vias 225, and connection bumps 230. The memory chips 210 may be stacked on the redistribution substrate 300 so as to align their sidewalls with each other. Adhesive layers 235 may be provided between the memory chips 210. The adhesive layer 235 may be, for example, a polymer tape including a dielectric material. The adhesive layer 235 may be interposed between the connection bumps 230, and thus an electrical short may be prevented between the connection bumps 230.

The first and second semiconductor chips 100 and 200 may be connected to the redistribution substrate 300 through first connection terminals 150. The first connection terminals 150 may be attached to the lower chip pads 111 and 221 of the first and second semiconductor chips 100 and 200. The first connection terminals 150 may be at least one selected from solder balls, conductive bumps, and conductive pillars. The first connection terminals 150 may include one or more of copper, tin, and lead. The first connection terminals 150 may each have a thickness of, for example, about 30 µm to about 70 µm.

The redistribution substrate 300 may be provided thereon with a molding layer 330 that covers the first and second semiconductor chips 100 and 200. The molding layer 330 may have a sidewall aligned with that of the redistribution substrate 300. The molding layer 330 may have a top surface substantially coplanar with those of the first and second semiconductor chips 100 and 200. The molding layer 330 may include a dielectric polymer, such as an epoxy molding compound (EMC).

A first under-fill layer may be interposed between the first semiconductor chip 100 and the redistribution substrate 300 and between the second semiconductor chips 200 and the redistribution substrate 300. The first under-fill layer may fill gaps between the first connection terminals 150. The first under-fill layer may include, for example, a thermo-curable resin or a photo-curable resin. The first under-fill layer may further include an inorganic filler or an organic filler. In some example embodiments, the first under-fill layer may be omitted, and the molding layer 330 may fill gaps between the redistribution substrate 300 and bottom surfaces of the first and second semiconductor chips 100 and 200.

The redistribution substrate 300 may be disposed on the package substrate 500, and may be connected to the package substrate 500 through second connection terminals 350. The redistribution substrate 300 may include a chip region and an edge region around the chip region. The first and second semiconductor chips 100 and 200 may be disposed on the chip region of the redistribution substrate 300.

The redistribution substrate 300 may have a top surface 300a adjacent the first and second semiconductor chips 100 and 200 and a bottom surface 300b opposite the top surface 300a. The redistribution substrate 300 may include a plurality of dielectric layers 20 that are sequentially stacked and a plurality of redistribution patterns 50 that are disposed in each dielectric layer 20. The redistribution patterns 50 may be formed by a method discussed above with reference to FIGS. 1 to 13. The redistribution patterns 50 in different dielectric layers 20 may be electrically connected to each other through via parts 50b which will be discussed below.

The second connection terminals 350 may be attached to lower pads of the redistribution substrate 300. The second connection terminals 350 may be solder balls formed of tin, lead, and/or copper. The second connection terminals 350 may each have a thickness of about 40 µm to about 80 µm.

The package substrate 500 may be, for example, a printed circuit board, a flexible substrate, or a tape substrate. For example, the package substrate 500 may be one of a flexible printed circuit board, a rigid printed circuit board, and any combination thereof, each of which boards includes internal lines 521 formed therein.

The package substrate 500 may have a top surface and a bottom surface that are opposite to each other, and may include upper bonding pads 511, external bonding pads 513, and internal lines 521. The upper bonding pads 511 may be arranged on the top surface of the package substrate 500, and the external bonding pads 513 may be arranged on the bottom surface of the package substrate 500. The upper bonding pads 511 may be electrically connected through the internal lines 521 to the external bonding pads 513. External bonding terminals 550 may be attached to the external bonding pads 513. A ball grid array (BGA) may be provided as the external bonding terminals 550.

The thermal radiation structure 600 may include a thermal or thermally conductive material. The thermal conductive material may include a metallic material (e.g., copper and/or aluminum) or a carbon-containing material (e.g., graphene, graphite, and/or carbon nano-tube). The thermal radiation structure 600 may have a relatively high thermal conductivity. For example, a single metal layer or a plurality of stacked metal layers may be used as the thermal radiation structure 600. For another example, the thermal radiation structure 600 may include a heat sink or a heat pipe. For another example, the thermal radiation structure 600 may be configured to use water cooling.

A thermal conductive layer or thermally conductive layer 650 may be interposed between the thermal radiation structure 600 and the first and second semiconductor chips 100 and 200. The thermal conductive layer 650 may be in contact with a top surface of the semiconductor package 1000 and a bottom surface of the thermal radiation structure 600. The thermal conductive layer 650 may include a thermal interface material (TIM). The thermal interface material may include, for example, a polymer and thermal conductive particles. The thermal conductive particles may be distributed in the polymer. When the semiconductor package 1000 operates, heat produced from the semiconductor package 1000 may be transferred through the thermal conductive layer 650 to the thermal radiation structure 600.

According to the embodiment shown in FIG. 15, the semiconductor package 1000 may be configured such that the redistribution substrate 300 is formed and then the first and second semiconductor chips 100 and 200 are mounted on the redistribution substrate 300.

The redistribution substrate 300 may have a top surface 300a adjacent the first and second semiconductor chips 100 and 200 and a bottom surface 300b opposite the top surface 300a.

The redistribution substrate 300 may include a plurality of sequentially stacked dielectric layers 20 and a plurality of redistribution patterns 50 provided in each dielectric layer 20. As discussed above with reference to FIGS. 1 to 13, the redistribution patterns 50 may be formed in the dielectric layers 20. Each redistribution pattern 50 may include a line part 50a and a via part 50b, and the line part 50a may have a substantially even top surface TS and an uneven bottom surface BS. In some example embodiments, the bottom surface BS of the line part 50a may be convex toward the first and second semiconductor chips 100 and 200.

According to the embodiment shown in FIG. 16, different from the embodiment depicted in FIG. 15, the semiconductor package 1000 may be configured such that the redistribution substrate 300 is formed on active surfaces of the first and second semiconductor chips 100 and 200.

As discussed above, the redistribution substrate 300 may include a plurality of sequentially stacked dielectric layers 20 and a plurality of redistribution patterns 50 provided in each dielectric layer 20.

As discussed above with reference to FIGS. 1 to 13, the redistribution patterns 50 may be formed in the dielectric layers 20. Each redistribution pattern 50 may include a line part 50a and a via part 50b, and the line part 50a may have a substantially even top surface TS and an uneven bottom surface BS. In some example embodiments, the bottom surface of the line part 50a may be concave toward or relative to the first and second semiconductor chips 100 and 200. For example, the bottom surface BS of the line part 50a may be convex toward the package substrate 500.

Referring to FIG. 17, the redistribution substrate 300 may include a base substrate 311, through vias 313, and a redistribution layer 320 including redistribution patterns 50.

The base substrate 311 may be a silicon substrate or a silicon-on-insulator (SOI) substrate. Alternatively, the base substrate 311 may be a glass substrate, a ceramic substrate, a polymer substrate, or any suitable substrate that can provide proper protection and/or interconnection functions. The base substrate 311 may include active electronic devices and/or passive electronic devices. The base substrate 311 may have protective dielectric layers on top and bottom surfaces thereof.

The through vias 313 may penetrate the base substrate 311, and may electrically connect lower and upper pads 315 and 317 to each other. The through vias 313 may include a metallic material, such as tungsten (W), aluminum (Al), or copper (Cu).

The redistribution layer 320 may include a plurality of stacked dielectric layers 20 and a plurality of redistribution patterns 50 provided in each dielectric layer 20. Each redistribution pattern 50 may include a line part 50a and a via part 50b, and the line part 50a may have a substantially even top surface TS and an uneven bottom surface BS. In some example embodiments, the bottom surface BS of the line part 50a may be convex toward the first and second semiconductor chips 100 and 200.

Figure 18:
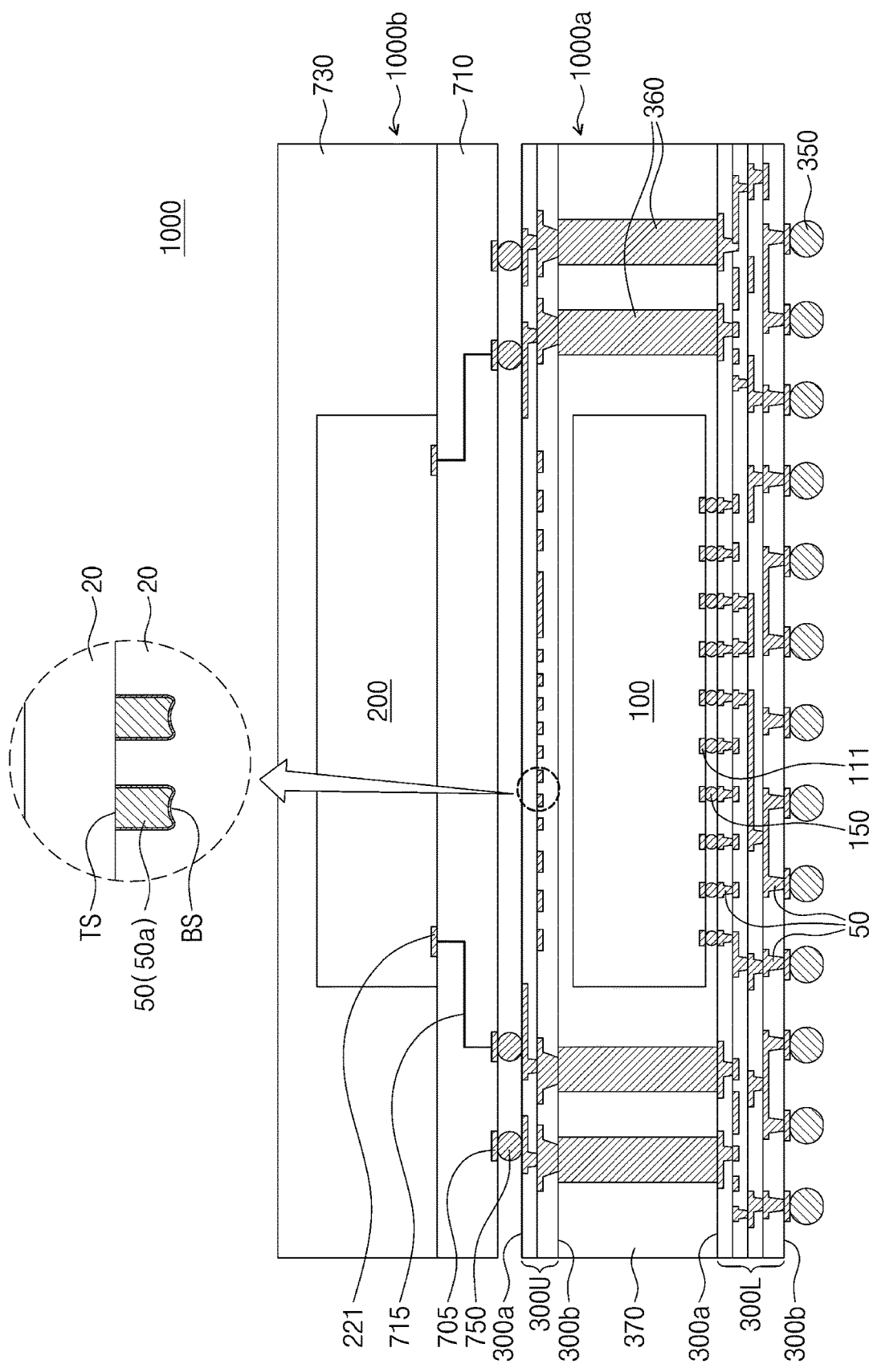
FIGS. 18, 19, and 20 illustrate cross-sectional views showing a semiconductor package according to some example embodiments of the present inventive concepts.
Figure 19:
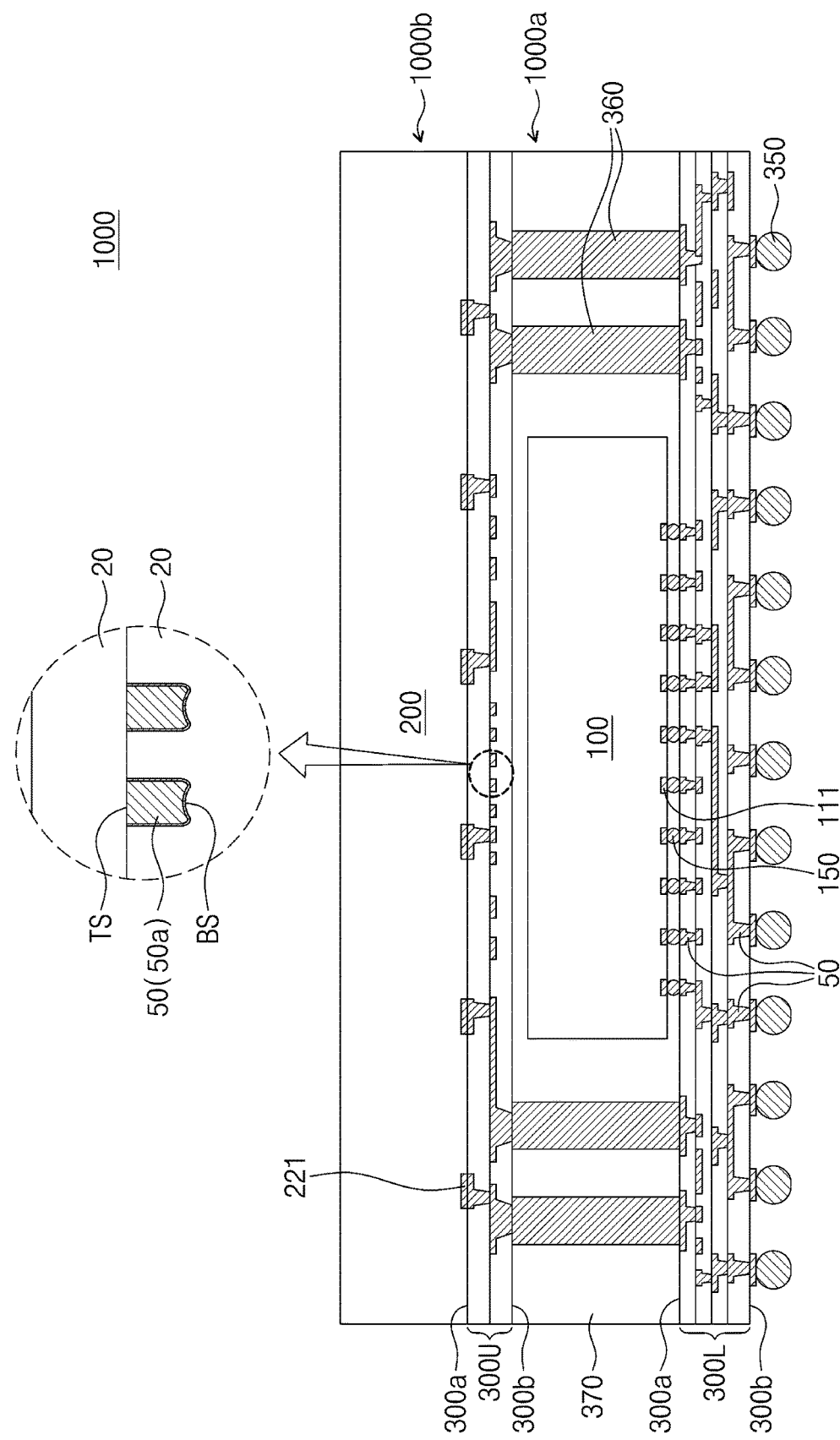
Figure 20:
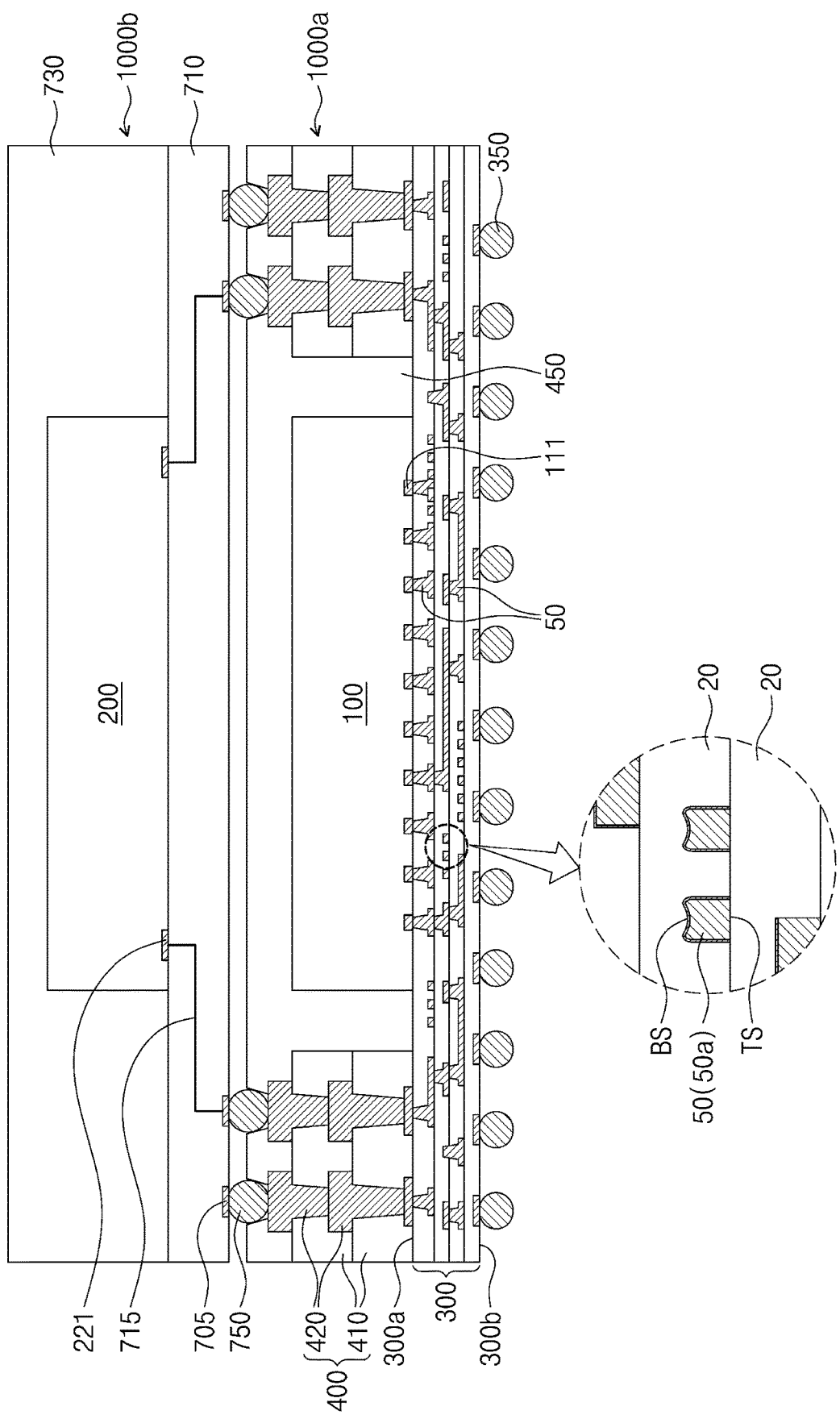

FIGS. 18, 19, and 20 illustrate cross-sectional views showing a semiconductor package according to some example embodiments of the present inventive concepts. The same technical features as those of the embodiments discussed above with reference to FIGS. 1 to 8 may be omitted in the interest of brevity of description.

Referring to FIG. 18, a semiconductor package 1000 according to the present embodiment may include a first semiconductor package 1000a and a second semiconductor package 1000b disposed on the first semiconductor package 1000a.

The first semiconductor package 1000a may include a lower redistribution substrate 300L, an upper redistribution substrate 300U, a first semiconductor chip 100, metal pillars 360, and a molding layer 370.

As discussed above, each of the lower and upper redistribution substrate 300L and 300U may include a plurality of dielectric layers 20 and a plurality of redistribution patterns 50. Each redistribution pattern 50 may include a line part 50a and a via part 50b, and the line part 50a may have a substantially even top surface TS and an uneven bottom surface BS.

The first semiconductor chip 100 may be provided on the lower redistribution substrate 300L. When viewed in plan, the first semiconductor chip 100 may be disposed on a central region of the lower redistribution substrate 300L. The first semiconductor chip 100 may have chip pads 111 on a bottom surface thereof. The bottom surface of the first semiconductor chip 100 may be disposed to face a top surface 300a of the lower redistribution substrate 300L, and the chip pads 111 of the first semiconductor chip 100 may be connected to the redistribution patterns 50 of the lower redistribution substrate 300L. First connection terminals 150 may be attached to and be between the chip pads 111 of the first semiconductor chip 100 and the redistribution patterns 50 of the lower redistribution substrate 300L.

The metal pillars 360 may be disposed around the first semiconductor chip 100, and may electrically connect the lower redistribution substrate 300L to the upper redistribution substrate 300U. The metal pillars 360 may penetrate the molding layer 370, and may have their top surfaces coplanar with that of the molding layer 370. The metal pillars 360 may have their bottom surfaces in direct contact with the redistribution patterns 50 of the lower redistribution substrate 300L.

The molding layer 370 may be provided between the lower and upper redistribution substrates 300L and 300U, and may cover the first semiconductor chip 100. The molding layer 370 may be provided on the top surface 300a of the lower redistribution substrate 300L, and may cover or surround a sidewall and a top surface of the first semiconductor chip 100. The molding layer 370 may fill gaps between the metal pillars 360, and may have a thickness substantially the same as lengths of the metal pillars 360. The molding layer 370 may include a dielectric polymer, such as an epoxy-based molding compound. The molding layer 370 may be referred to as a lower molding layer herein.

The second semiconductor package 1000b may be disposed on the upper redistribution substrate 300U.

The second semiconductor package 1000b may include a package substrate 710, a second semiconductor chip 200, and an upper molding layer 730. The package substrate 710 may be a printed circuit board. Alternatively, a redistribution substrate may be used as the package substrate 710. Metal pads 705 may be disposed on a bottom surface of the package substrate 710.

The second semiconductor chip 200 may be disposed on the package substrate 710. The second semiconductor chip 200 may include integrated circuits, and the integrated circuits may include a memory circuit, a logic circuit, or a combination thereof. The second semiconductor chip 200 may include chip pads 221 electrically connected to the metal pads 705 through wiring lines 715 provided in the package substrate 710. The package substrate 710 may be provided thereon with the upper molding layer 730 that covers the second semiconductor chip 200. The upper molding layer 730 may include a dielectric polymer, such as an epoxy-based polymer.

Connection terminals 750 may be provided between the metal pads 705 of the package substrate 710 and redistribution pads of the upper redistribution substrate 300U.

Referring to FIG. 19, a semiconductor package 1000 according to the present embodiment may include a lower redistribution substrate 300L, an upper redistribution substrate 300U, a first semiconductor chip 100, metal pillars 360, a molding layer 370, and a second semiconductor chip 200.

The lower redistribution substrate 300L, the upper redistribution substrate 300U, the first semiconductor chip 100, the metal pillars 360, and the molding layer 370 may be substantially the same as those of the first semiconductor package 1000a discussed with reference to FIG. 18.

According to the present embodiment, the second semiconductor chip 200 may have a bottom surface in direct contact with a dielectric layer 20 of the upper redistribution substrate 300U, and may also have chip pads 221 in direct contact with redistribution pads of the upper redistribution substrate 300U. The chip pads 221 of the second semiconductor chip 200 may correspond to the redistribution pads of the upper redistribution substrate 300U, and may have their sizes and arrangement substantially the same as those of the redistribution pads of the upper redistribution substrate 300U. The chip pads 221 of the second semiconductor chip 200 may include metal, such as copper (Cu), nickel (Ni), cobalt (Co), tungsten (W), titanium (T1), tin (Sn), or any alloy thereof.

Referring to FIG. 20, a semiconductor package 1000 according to the present embodiment may include a first semiconductor package 1000a and a second semiconductor package 1000b disposed on the first semiconductor package 1000a.

The first semiconductor package 1000a may include a redistribution substrate 300, a connection substrate 400 on the redistribution substrate 300, a first semiconductor chip 100, and a molding layer 450.

As discussed above, the redistribution substrate 300 may include a plurality of dielectric layers 20 and a plurality of redistribution patterns 50. Each redistribution pattern 50 may include a line part 50a and a via part 50b, and the line part 50a may have a substantially even top surface TS and an uneven bottom surface BS.

The connection substrate 400 may have an opening that exposes a top surface of the redistribution substrate 300, and the first semiconductor chip 100 may be disposed in the opening of the connection substrate 400. The connection substrate 400 may be provided before or after the first semiconductor chip 100 is provided. For example, a hole or opening may be formed in a printed circuit board, and the printed circuit board having the hole may be used as the connection substrate 400. When viewed in plan, the first semiconductor chip 100 may be disposed on a central region of the redistribution substrate 300.

The connection substrate 400 may include base layers 410 and conductive structures 420. The base layers 410 may include a dielectric material. For example, the base layers 410 may include a carbon-based material, a ceramic, or a polymer. The conductive structure 420 may include line patterns and a line via that connects the line patterns. The conductive structures 420 of the connection substrate 400 may be connected to pads of the redistribution substrate 300.

The conductive structures 420 may include metal. The conductive structures 420 may include, for example, at least one selected from copper, aluminum, gold, lead, stainless steels, silver, iron, and any alloy thereof.

The molding layer 450 may be formed on the first semiconductor chip 100 and the connection substrate 400. The molding layer 450 may extend into and fill a gap between the first semiconductor chip 100 and the connection substrate 400. The molding layer 450 may include a dielectric polymer, such as an epoxy-based polymer. The molding layer 450 may partially expose the conductive structures 420 of the connection substrate 400. The molding layer 450 may be referred to as a lower molding layer herein.

The second semiconductor package 1000b may include a package substrate 710, a second semiconductor chip 200, and an upper molding layer 730. The package substrate 710 may be a printed circuit board. Alternatively, a redistribution substrate may be used as the package substrate 710. Metal pads 705 may be disposed on a bottom surface of the package substrate 710.

The second semiconductor chip 200 may be disposed on the package substrate 710. The second semiconductor chip 200 may include integrated circuits, and the integrated circuits may include a memory circuit, a logic circuit, or a combination thereof. The second semiconductor chip 200 may include chip pads 221 electrically connected to the metal pads 705 through wiring lines 715 provided in the package substrate 710. The package substrate 710 may be provided thereon with the upper molding layer 730 that covers the second semiconductor chip 200. The upper molding layer 730 may include a dielectric polymer, such as an epoxy-based polymer.

Connection terminals 750 may be provided in upper holes or openings of the molding layer 450. The connection terminals 750 may be provided between the metal pads 705 of the package substrate 710 and the conductive structures 420 of the connection substrate 400.

According to some example embodiments of the present inventive concepts, a hardmask pattern may be used to anisotropically etch a dielectric layer, and then trenches may be filled with a metallic material to form redistribution patterns. Therefore, the redistribution patterns may have their sidewalls substantially perpendicular to top surfaces thereof, and a space may be securely obtained between neighboring redistribution patterns. Accordingly, it may be possible to accomplish fine-linewidth redistribution patterns and to achieve a compact-sized semiconductor package.

Although the present inventive concepts have been described in connection with some example embodiments of the present inventive concepts illustrated in the accompanying drawings, it will be understood to those skilled in the art that various changes and modifications may be made without departing from the scope of the present inventive concepts.

What is claimed is:

1. A semiconductor package, comprising:
   a redistribution substrate including a plurality of redistribution line patterns in a dielectric layer; and
   a semiconductor chip on the redistribution substrate, the semiconductor chip including a plurality of chip pads electrically connected to the redistribution line patterns,
   wherein each of the redistribution line patterns includes a substantially planar top surface and a nonplanar bottom surface,
   wherein each of the redistribution line patterns includes a central portion and edge portions on opposite sides of the central portion, and each of the redistribution line patterns has a first thickness as a minimum thickness at the central portion and a second thickness as a maximum thickness at the edge portions, wherein the first thickness and the second thickness are measured in a direction perpendicular to a top surface of the dielectric layer, and wherein the nonplanar bottom surface is in direct contact with the dielectric layer.

2. The semiconductor package of claim 1, wherein a difference between the first and second thicknesses of each of the redistribution line patterns is in a range of about 0.1 µm to about 0.2 µm.

3. The semiconductor package of claim 1, wherein the nonplanar bottom surface of each of the redistribution line patterns is upwardly convex at the central portion.

4. The semiconductor package of claim 1, wherein the nonplanar bottom surface of each of the redistribution line patterns has a first radius of curvature at the edge portions and a second radius of curvature at the central portion, the second radius of curvature being different from the first radius of curvature.

5. The semiconductor package of claim 1, wherein the edge portions of each of the redistribution line patterns include rounded edges.

6. The semiconductor package of claim 5, wherein the rounded edges have a radius of curvature of about 0.1 µm to about 0.3 µm.

7. The semiconductor package of claim 1, wherein
the redistribution line patterns are spaced apart from each other by a first spacing,
each of the redistribution line patterns has a first width, and
the first width and the first spacing each have a range of about 1.5 µm to about 2.5 µm.

8. The semiconductor package of claim 1, wherein each of the redistribution line patterns includes a sidewall oriented at a first angle relative to the top surface of the dielectric layer,
wherein the first angle has a range of about 85° to about 95°.

9. The semiconductor package of claim 1, wherein each of the redistribution line patterns includes:
a metal pattern; and
a barrier metal pattern that has a substantially uniform thickness covering opposite sidewalls of the metal pattern and a bottom surface of the metal pattern.

10. The semiconductor package of claim 1, wherein the substantially planar top surface of each of the redistribution line patterns is substantially coplanar with the top surface of the dielectric layer.

11. The semiconductor package of claim 1, wherein the second thickness of each of the redistribution line patterns has a range of about 2.5 µm to about 4.0 µm.

12. The semiconductor package of claim 1, wherein the dielectric layer includes at least one selected from polyimide, polybenzoxazole, phenolic polymers, and benzocyclobutene polymers.

13. A semiconductor package, comprising:
a redistribution substrate including a plurality of redistribution patterns in a dielectric layer; and
a semiconductor chip on the redistribution substrate, the semiconductor chip including a plurality of chip pads electrically connected to the redistribution patterns,
wherein each of the redistribution patterns includes:
a line part in the dielectric layer; and
a via part that penetrates the dielectric layer and is connected to the line part,
wherein the line parts of each of the redistribution patterns extend parallel to each other in a first direction,
wherein at least some of the line parts of the plurality of redistribution patterns have a first width in a second direction perpendicular to the first direction,
wherein the line part of each of the redistribution patterns includes a central portion and edge portions on opposite sides of the central portion, and the line part of each of the redistribution patterns includes a bottom surface that is upwardly convex at the central portion, and
wherein the bottom surface is in direct contact with the dielectric layer.

14. The semiconductor package of claim 13, wherein each of the redistribution patterns includes a top surface that is substantially planar.

15. The semiconductor package of claim 13, wherein the line part of each of the redistribution patterns includes rounded edges between the bottom surface of the line part and opposite sidewalls of the line part.

16. The semiconductor package of claim 13, wherein the line part of each of the redistribution patterns has a first thickness as a minimum thickness at the central portion and a second thickness as a maximum thickness at the edge portions.

17. The semiconductor package of claim 13, wherein the plurality of redistribution patterns include:
a plurality of first redistribution patterns each of which has the first width; and
a plurality of second redistribution patterns each of which has a second width greater than the first width,
wherein the line part of each of the first and second redistribution patterns has rounded edges between the bottom surface of the line part and opposite sidewalls of the line part,
wherein the rounded edges of each of the first redistribution patterns have a first radius of curvature, and
wherein the rounded edges of each of the second redistribution patterns have a second radius of curvature different from the first radius of curvature.

18. A semiconductor package, comprising:
a package substrate;
a redistribution substrate on the package substrate, the redistribution substrate including a photosensitive polymer layer and a plurality of redistribution patterns in the photosensitive polymer layer;
a first semiconductor chip on the redistribution substrate;
a second semiconductor chip on the redistribution substrate and spaced apart from the first semiconductor chip, the second semiconductor chip including a plurality of vertically stacked memory chips;
a plurality of first connection terminals between the redistribution substrate and the first semiconductor chip and between the redistribution substrate and the second semiconductor chip;
a plurality of second connection terminals connecting the package substrate to the redistribution substrate;
a molding layer on the redistribution substrate, the molding layer at least partially covering the first semiconductor chip and the second semiconductor chip; and
a thermal radiation structure on the package substrate, the thermal radiation structure covering or overlying the redistribution substrate, the first semiconductor chip, and the second semiconductor chip,
wherein each of the redistribution patterns includes:
a line part that extends along one direction in a dielectric layer; and a via part that penetrates the dielectric layer and is connected to the line part, wherein the line part of each of the redistribution patterns includes a substantially planar top surface, a nonplanar bottom surface, and a first and second rounded edges between the nonplanar bottom surface and opposite first and second sidewalls of the line part, wherein the line part of each of the redistribution patterns includes a central portion and first and second edge portions on opposite sides of the central portion, and wherein the line part of each of the redistribution patterns has a first thickness as a minimum thickness at the central portion and a second thickness as a maximum thickness at the first and second edge portions.

19. The semiconductor package of claim 18, wherein, on the central portion of the line part of each of the redistribution patterns, the nonplanar bottom surface is convex in a direction toward the first and second semiconductor chips.

20. The semiconductor package of claim 18, wherein, on the central portion of the line part of each of the redistribution patterns, the nonplanar bottom surface is concave relative to the first and second semiconductor chips.

* * * * *